(12) United States Patent
Tanabe

(10) Patent No.: US 8,785,085 B2
(45) Date of Patent: Jul. 22, 2014

(54) METHOD OF MANUFACTURING A MASK BLANK SUBSTRATE, METHOD OF MANUFACTURING A MASK BLANK, METHOD OF MANUFACTURING A TRANSFER MASK, AND METHOD OF MANUFACTURING A SEMICONDUCTOR DEVICE

(75) Inventor: Masaru Tanabe, Tokyo (JP)

(73) Assignee: Hoya Corporation, Tokyo (JP)

( * ) Notice: Subject to any disclaimer, the term of this patent is extended or adjusted under 35 U.S.C. 154(b) by 104 days.

(21) Appl. No.: 13/638,505

(22) PCT Filed: Mar. 29, 2011

(86) PCT No.: PCT/JP2011/057766
§ 371 (c)(1),
(2), (4) Date: Sep. 28, 2012

(87) PCT Pub. No.: WO2011/122608
PCT Pub. Date: Oct. 6, 2011

(65) Prior Publication Data
US 2013/0022900 A1    Jan. 24, 2013

(30) Foreign Application Priority Data

Mar. 30, 2010 (JP) .................................. 2010-077849

(51) Int. Cl.
*G03F 7/20* (2006.01)
*G06F 17/50* (2006.01)
*G03B 27/62* (2006.01)

(52) U.S. Cl.
USPC ............................................................ 430/5

(58) Field of Classification Search
CPC ............. G03F 1/20; G03F 1/72; G03F 7/703; G03B 27/62

USPC ............ 430/5, 30, 311, 313, 394; 355/53, 72, 355/75, 77
See application file for complete search history.

(56) References Cited

U.S. PATENT DOCUMENTS

| 7,643,130 B2 | 1/2010 | Yoshitake et al. |
| 2003/0153114 A1 | 8/2003 | Itoh |
| 2006/0024591 A1 | 2/2006 | Itoh |
| 2006/0194126 A1 | 8/2006 | Tanabe |
| 2007/0259290 A1 | 11/2007 | Okita |

FOREIGN PATENT DOCUMENTS

| JP | 2003-50458 A | 2/2003 |
| JP | 2006-39223 A | 2/2006 |
| JP | 2007053402 A | 3/2007 |

(Continued)

OTHER PUBLICATIONS

Japanese Office Action corresponding to Japanese Patent Application No. 2012-508336, dated Sep. 26, 2012.
Japanese Office Action corresponding to Japanese Patent Application No. 2012-508336, mailed Feb. 27, 2013.

(Continued)

*Primary Examiner* — Stephen Rosasco
(74) *Attorney, Agent, or Firm* — Sughrue Mion, PLLC

(57) ABSTRACT

In a simulation step of simulating a surface configuration of a substrate which is used for a mask blank and which is set to an exposure apparatus, height information from a reference plane is derived from a plurality of measurement points on a main surface of the substrate. From the height information, a curved surface of fourth, fifth, or sixth order is approximated which is represented by a polynomial specified by a plurality of terms and coefficients of the terms. The coefficients are stored as coefficient information in association with the substrate.

44 Claims, 5 Drawing Sheets

(56) References Cited

FOREIGN PATENT DOCUMENTS

| | | |
|---|---|---|
| JP | 2007150287 A | 6/2007 |
| KR | 2006-0094888 A | 8/2006 |
| WO | 2007125853 A1 | 11/2007 |
| WO | 2010/110139 A1 | 9/2010 |

OTHER PUBLICATIONS

Office Action issued in corresponding Korean Patent Application No. 519980842373 dated Oct. 31, 2013.

Masato Saito, et al., "Mask image position correction for double patterning lithography", Photomask and Next-Generation Lithography Mask Technology XV, Proceedings of SPIE, 2008, pp. 70280D1-70280D-9, vol. 7028.

(A)

(B)

METHOD OF MANUFACTURING A MASK BLANK SUBSTRATE, METHOD OF MANUFACTURING A MASK BLANK, METHOD OF MANUFACTURING A TRANSFER MASK, AND METHOD OF MANUFACTURING A SEMICONDUCTOR DEVICE

CROSS REFERENCE TO RELATED APPLICATIONS

This application is a National Stage of International Application No. PCT/JP2011/057766, filed on Mar. 29, 2011, which claims priority from Japanese Patent Application No. 2010-077849, filed on Mar. 30, 2010, the contents of all of which are incorporated herein by reference in their entirety.

TECHNICAL FIELD

This invention relates to a method of manufacturing a mask blank substrate, a method of manufacturing a mask blank, a method of manufacturing a transfer mask, and a method of manufacturing a semiconductor device in the semiconductor field.

BACKGROUND ART

With the miniaturization of semiconductor devices in recent years, the reduction in the wavelength of an exposure light source for use in the photolithography technique has been proceeding. In the advanced transmission photolithography field, an ArF excimer laser (wavelength 193 nm) with a wavelength of 200 nm or less is used as an exposure light source. However, a demand for further miniaturization has been increasing and such a demand is difficult to satisfy only by using the ArF excimer laser light as the exposure light source. In order to satisfy the demand, an increase of NA (numerical number) has been adopted by using the oblique illumination method or the like. With the increase in NA, however, the focal depth of an exposure apparatus has been decreasing significantly. As a consequence, when a transfer mask is set (chucked) to the exposure apparatus by vacuum suction or the like, if the transfer mask is deformed to reduce its flatness as compared with that before the setting (chucking), focus positions may be often deviated on transferring a mask pattern of the transfer mask onto a semiconductor substrate as a transfer object. Thus, the transfer accuracy has been degraded.

In view of this, it has been proposed to simulate, using the finite element method, a shape of a transparent substrate for use in a mask blank when the transparent substrate is set in an exposure apparatus, thereby estimating a flatness thereof.

However, there has been a problem that, although the shape of a main surface of the substrate can be estimated somewhat accurately by the simulation of the substrate shape using the finite element method, the simulation is very time-consuming.

In the DRAM hp32 nm and subsequent generations, it has been studied to use the double patterning technique. The double patterning technique is to divide a single fine high-density pattern into two relatively coarse patterns, to produce transfer masks for the two patterns, respectively, and to form a fine high-density pattern on an object using these two transfer masks. As the double patterning technique, there have been proposed several techniques such as the double exposure technique, the narrow-sense double patterning technique, the technique using a spacer, and the technique using resist freezing. However, these techniques are common in carrying out two-time exposure processes using two transfer masks to thereby form a single fine high-density pattern. That is, two transfer masks are not simultaneously used in a one-time exposure process, but a process of chucking a transfer mask on a mask stage of an exposure apparatus and irradiating exposure light onto the transfer mask to transfer a transfer pattern is carried out per transfer mask. Accordingly, the positioning accuracy of two patterns should be significantly enhanced than conventional. As a consequence, there has arisen a need to design a transfer pattern to be formed in each transfer mask by taking into account also the position offset of the pattern that occurs when the transfer mask is chucked on the mask stage of the exposure apparatus.

In view of this, it is now being studied to correct a transfer pattern using simulation results of a substrate shape when writing the transfer pattern on a photoresist-coated mask blank, and to write a corrected transfer pattern in the course of the manufacture of an exposure mask (e.g. Non-Patent Document 1).

PRIOR ART DOCUMENT

Non-Patent Document

Non-Patent Document 1: Proceeding of SPIE "Mask image position correction for double patterning lithography", Photomask and Next-Generation Lithography Mask Technology XV Vol. 7028, 2008, p. 7028D. 1-p. 7028D. 9

SUMMARY OF THE INVENTION

Problem to be Solved by the Invention

In the above-mentioned prior art, in order to correct a transfer pattern, a simulation is carried out to estimate positions at respective points of a substrate main surface in a state of being set in an exposure apparatus, and the estimated data are used as they are for correcting the transfer pattern. However, in order to accurately carry out the simulation, the data are required at a large number of points of the substrate main surface and, therefore, there has been a problem that if the simulation results are used as they are, the amount of the data is so large as to make it difficult to handle the data.

Means for Solving the Problem

In order to solve the above-mentioned problem, the present inventor has considered to reduce the data amount by approximating the simulation results to a predetermined approximate curved surface and has considered to select an appropriate approximate curved surface by taking into account the approximation accuracy of the positions at the respective points on the substrate and the data amount.

According to this invention, a method of manufacturing a mask blank substrate is featured by comprising a preparation step of preparing a transparent substrate having a precision-polished main surface, a shape measurement step of measuring height information of the main surface from a reference plane at a plurality of measurement points set in an actual measurement region of the main surface, thereby obtaining a before-chucking main surface shape, a simulation step of obtaining, through simulation, an after-chucking main surface shape which is height information of the main surface from the reference plane at the plurality of measurement points when the transparent substrate is chucked on a mask stage of an exposure apparatus, an approximate curved surface calculation step of calculating an approximate curved surface based on the after-chucking main surface shape, and a recording step of recording information of the approximate curved surface in a recording apparatus in association with the transparent substrate. The shape measurement step is carried out using a known flatness measuring apparatus utilizing an optical interferometer, or the like. It is needless to say that the simulation step is carried out using a computer.

The method of manufacturing a mask blank substrate according to this invention mentioned above is characterized in that the approximate curved surface is given by a function of several variables expressed by a three-dimensional coordinate system which is obtained by setting an X-coordinate axis and a Y-coordinate axis on the reference plane and setting a Z-coordinate axis in a direction perpendicular to the reference plane, and the recording step records information of coefficients of the function of several variables as the information of the approximate curved surface in the recording apparatus.

In the method of manufacturing a mask blank substrate according to this invention mentioned above, it is preferable that the approximate curved surface is given by the function of several variables in which X or Y is of fourth or higher degree.

In the method of manufacturing a mask blank substrate according to this invention mentioned above, it is preferable to include a partial differential function calculation step of calculating an X partial differential function by partially differentiating the function of several variables with respect to X and calculating a Y partial differential function by partially differentiating the function of several variables with respect to Y, and it is preferable that the recording step also records information of coefficients of the X partial differential function and the Y partial differential function as information of the approximate curved surface in the recording apparatus.

A method of manufacturing a mask blank substrate according to this invention is featured by comprising a preparation step of preparing a transparent substrate having a precision-polished main surface, a shape measurement step of measuring height information of the main surface from a reference plane at a plurality of measurement points set in an actual measurement region of the main surface, thereby obtaining a before-chucking main surface shape, a simulation step of obtaining, through simulation by the use of a computer, an after-chucking main surface shape which is height information of the main surface from the reference plane at the plurality of measurement points when the transparent substrate is chucked on a mask stage of an exposure apparatus, an approximate curved surface calculation step of calculating, based on the after-chucking main surface shape, an approximate curved surface given by a function of several variables expressed by a three-dimensional coordinate system which is obtained by setting an X-coordinate axis and a Y-coordinate axis on the reference plane and setting a Z-coordinate axis in a direction perpendicular to the reference plane, a partial differential function calculation step of calculating an X partial differential function by partially differentiating the function of several variables with respect to X and calculating a Y partial differential function by partially differentiating the function of several variables with respect to Y, and a recording step of recording information of coefficients of the X partial differential function and the Y partial differential function as information of the approximate curved surface in a recording apparatus in association with the transparent substrate. The approximate curved surface calculation step and the partial differential function calculation step are carried out using a computer.

In the method of manufacturing a mask blank substrate according to this invention mentioned above, it is preferable that the approximate curved surface is given by the function of several variables in which X or Y is of fourth or higher degree.

In the method of manufacturing a mask blank substrate according to this invention mentioned above, it is preferable that the simulation step comprises calculating a gravity deformation amount which is a deformation amount of the main surface caused by gravity when the transparent substrate is placed on the mask stage, calculating a lever deformation amount which is caused by lever deformation of the main surface with respect to the mask stage operable as a fulcrum when the transparent substrate is chucked on the mask stage, a copy deformation amount which is caused by deformation of the main surface following a shape of the mask stage when the transparent substrate is chucked on the mask stage, and a twist deformation amount which is caused by deformation of the main surface that corrects twist thereof when the transparent substrate is chucked on the mask stage; and calculating the after-chucking main surface shape by adding the calculated deformation amounts to the before-chucking main surface shape.

In the method of manufacturing a mask blank substrate according to this invention mentioned above, it is preferable to include a selection step of selecting, as a mask blank substrate, the transparent substrate whose flatness in a calculation region obtained from the after-chucking main surface shape is a predetermined value or less.

In the method of manufacturing a mask blank substrate according to this invention mentioned above, it is preferable that the calculation region is a 132 mm square region with respect to a center of the transparent substrate.

In the method of manufacturing a mask blank substrate according to this invention mentioned above, it is preferable that the predetermined value of the flatness is 0.24 µm or less.

In the method of manufacturing a mask blank substrate according to this invention mentioned above, it is preferable to include a step of selecting the transparent substrate whose flatness in a predetermined region of the before-chucking main surface shape is 0.4 µm or less. The flatness represents a difference between maximum and minimum height values of the main surface from the reference plane in the calculation region or the predetermined region.

A method of manufacturing a mask blank according to this invention is featured by comprising a thin film forming step of forming a pattern-formation thin film on the main surface of the mask blank substrate manufactured by the method of manufacturing a mask blank substrate mentioned above.

According to this invention, a method of manufacturing a transfer mask using the mask blank manufactured by the method of manufacturing a mask blank mentioned above is featured by comprising a resist film forming step of forming a resist film on the pattern-formation thin film of the mask blank, a pattern correction step of correcting a transfer pattern, to be formed in the resist film, based on the information of the approximate curved surface, and a resist pattern forming step of forming, in the resist film, the transfer pattern corrected in the pattern correction step.

According to this invention, a method of manufacturing a semiconductor device is featured by comprising a step of, by the use of the transfer mask manufactured by the method of manufacturing a transfer mask mentioned above, exposing and transferring the transfer pattern of the transfer mask to a resist film on a wafer by photolithography.

The description has been given above of the case where this invention is applied to the transparent substrate before forming a thin film. However, this invention is likewise applicable to a method of manufacturing a mask blank after forming a thin film. Namely, a method of manufacturing a mask blank according to this invention is featured by comprising a preparation step of preparing a mask blank having a thin film on a main surface of a transparent substrate, a shape measurement step of measuring height information of a main surface of the mask blank from a reference plane at a plurality of measurement points set in an actual measurement region of the main surface, thereby obtaining a before-chucking main surface shape, a simulation step of obtaining, through simulation, an after-chucking main surface shape which is height information of the main surface from the reference plane at the plurality of measurement points when the mask blank is chucked on a mask stage of an exposure apparatus, an approximate curved surface calculation step of calculating an approximate curved surface based on the after-chucking main surface shape, and a recording step of recording information of the approximate curved surface in a recording apparatus in association with the mask blank.

In the method of manufacturing a mask blank according to this invention mentioned above, it is preferable that the approximate curved surface is given by a function of several variables expressed by a three-dimensional coordinate system which is obtained by setting an X-coordinate axis and a Y-coordinate axis on the reference plane and setting a Z-coordinate axis in a direction perpendicular to the reference plane and that the recording step records information of coefficients of the function of several variables as the information of the approximate curved surface in the recording apparatus.

In the method of manufacturing a mask blank according to this invention mentioned above, it is preferable that the approximate curved surface is given by the function of several variables in which X or Y is of fourth or higher degree.

In the method of manufacturing a mask blank according to this invention mentioned above, it is preferable to include a partial differential function calculation step of calculating an X partial differential function by partially differentiating the function of several variables with respect to X and calculating a Y partial differential function by partially differentiating the function of several variables with respect to Y and it is preferable that the recording step also records information of coefficients of the X partial differential function and the Y partial differential function as information of the approximate curved surface in the recording apparatus.

A method of manufacturing a mask blank according to this invention is featured by comprising a preparation step of preparing a mask blank having a thin film on a main surface of a transparent substrate, a shape measurement step of measuring height information of a main surface of the mask blank from a reference plane at a plurality of measurement points set in an actual measurement region of the main surface, thereby obtaining a before-chucking main surface shape, a simulation step of obtaining, through simulation, an after-chucking main surface shape which is height information of the main surface from the reference plane at the plurality of measurement points when the mask blank is chucked on a mask stage of an exposure apparatus, an approximate curved surface calculation step of calculating, based on the after-chucking main surface shape, an approximate curved surface given by a function of several variables expressed by a three-dimensional coordinate system which is obtained by setting an X-coordinate axis and a Y-coordinate axis on the reference plane and setting a Z-coordinate axis in a direction perpendicular to the reference plane, a partial differential function calculation step of calculating an X partial differential function by partially differentiating the function of several variables with respect to X and calculating a Y partial differential function by partially differentiating the function of several variables with respect to Y, and a recording step of recording information of coefficients of the X partial differential function and the Y partial differential function as information of the approximate curved surface in a recording apparatus in association with the transparent substrate.

In the method of manufacturing a mask blank according to this invention mentioned above, it is preferable that the approximate curved surface is given by the function of several variables in which X or Y is of fourth or higher degree.

In the method of manufacturing a mask blank according to this invention mentioned above, it is preferable that the simulation step comprises calculating a gravity deformation amount which is a deformation amount of the main surface caused by gravity when the mask blank is placed on the mask stage, calculating a lever deformation amount which is caused by lever deformation of the main surface with respect to the mask stage operable as a fulcrum when the mask blank is chucked on the mask stage, a copy deformation amount which is caused by deformation of the main surface following a shape of the mask stage when the mask blank is chucked on the mask stage, and a twist deformation amount which is caused by deformation of the main surface that corrects twist thereof when the mask blank is chucked on the mask stage, and calculating the after-chucking main surface shape by adding the calculated deformation amounts to the before-chucking main surface shape.

In the method of manufacturing a mask blank according to this invention mentioned above, it is preferable to include a selection step of selecting the mask blank whose flatness in a calculation region obtained from the after-chucking main surface shape is a predetermined value or less.

In the method of manufacturing a mask blank according to this invention mentioned above, it is preferable that the calculation region is a 132 mm square region with respect to a center of the transparent substrate.

In the method of manufacturing a mask blank according to this invention mentioned above, it is preferable that the predetermined value of the flatness is 0.24 μm or less.

In the method of manufacturing a mask blank according to this invention mentioned above, it is preferable to include a step of selecting the mask blank whose flatness in a predetermined region obtained from the before-chucking main surface shape is 0.4 μm or less.

According to this invention, a method of manufacturing a transfer mask using the mask blank manufactured by the method of manufacturing a mask blank mentioned above, comprises a resist film forming step of forming a resist film on the pattern-formation thin film of the mask blank, a pattern correction step of correcting a transfer pattern, to be formed in the resist film, based on the information of the approximate curved surface, and a resist pattern forming step of forming, in the resist film, the transfer pattern corrected in the pattern correction step.

A method of manufacturing a semiconductor device according to this invention, comprises a step of, by the use of the transfer mask manufactured by the method of manufacturing a transfer mask mentioned above, exposing and transferring the transfer pattern of the transfer mask to a resist film on a wafer by photolithography.

According to this invention, a method of manufacturing a transfer mask is featured by comprising a preparation step of preparing a mask blank having a thin film on a main surface of a transparent substrate, a shape measurement step of measuring height information of a main surface of the mask blank from a reference plane at a plurality of measurement points set in an actual measurement region of the main surface, thereby obtaining a before-chucking main surface shape, a simulation step of obtaining, through simulation, an after-chucking main surface shape which is height information of the main surface from the reference plane at the plurality of measurement points when the mask blank is chucked on a mask stage of an exposure apparatus, an approximate curved surface calculation step of calculating an approximate curved surface based on the after-chucking main surface shape, a resist film forming step of forming a resist film on the pattern-formation thin film of the mask blank, a pattern correction step of correcting a transfer pattern, to be formed in the resist film, based on information of the approximate curved surface, and a resist pattern forming step of forming, in the resist film, the transfer pattern corrected in the pattern correction step.

In the method of manufacturing a transfer mask according to this invention mentioned above, it is preferable that the approximate curved surface is given by a function of several variables expressed by a three-dimensional coordinate system which is obtained by setting an X-coordinate axis and a Y-coordinate axis on the reference plane and setting a Z-coordinate axis in a direction perpendicular to the reference plane.

In the method of manufacturing a transfer mask according to this invention mentioned above, it is preferable that the approximate curved surface is given by the function of several variables in which X or Y is of fourth or higher degree.

In the method of manufacturing a transfer mask according to this invention mentioned above, it is preferable to include a partial differential function calculation step of calculating an X partial differential function by partially differentiating the function of several variables with respect to X and calculating a Y partial differential function by partially differentiating the function of several variables with respect to Y.

In the method of manufacturing a transfer mask according to this invention mentioned above, it is preferable that the simulation step comprises calculating a gravity deformation amount which is a deformation amount of the main surface caused by gravity when the mask blank is placed on the mask stage, calculating a lever deformation amount which is caused by lever deformation of the main surface with respect to the mask stage operable as a fulcrum when the mask blank is chucked on the mask stage, a copy deformation amount which is caused by deformation of the main surface following a shape of the mask stage when the mask blank is chucked on the mask stage, and a twist deformation amount which is caused by deformation of the main surface that corrects twist thereof when the mask blank is chucked on the mask stage, and calculating the after-chucking main surface shape by adding the calculated deformation amounts to the before-chucking main surface shape.

In the method of manufacturing a transfer mask according to this invention mentioned above, it is preferable to include a selection step of selecting the mask blank whose flatness in a calculation region obtained from the after-chucking main surface shape is a predetermined value or less.

In the method of manufacturing a transfer mask according to this invention mentioned above, it is also preferable that the calculation region is a 132 mm square region with respect to a center of the transparent substrate In the method of manufacturing a transfer mask according to this invention mentioned above, it is preferable that the predetermined value of the flatness is 0.24 μm or less.

In the method of manufacturing a transfer mask according to this invention mentioned above, it is preferable to include a step of selecting the mask blank whose flatness in a predetermined region obtained from the before-chucking main surface shape is 0.4 μm or less.

According to this invention, a method of manufacturing a semiconductor device comprises a step of, by the use of the transfer mask manufactured by the method of manufacturing a transfer mask mentioned above, exposing and transferring the transfer pattern of the transfer mask to a resist film on a wafer by photolithography.

Effect of the Invention

In this invention, simulation results are not used as they are, but data of an approximate curved surface is used for correcting a transfer pattern and, in the approximate curved surface, data are interpolated for regions (gaps) between measurement points where height information of a substrate main surface is obtained. Therefore, it is possible to easily and accurately perform calculation of position shift amounts and correction of a design transfer pattern also for the regions between the measurement points. Further, since a polynomial curved surface of about the fourth to sixth order is selected as an approximate curved surface, it is possible to shorten the calculation time and simultaneously to ensure the approximation accuracy.

MODE FOR CARRYING OUT THE INVENTION

Hereinbelow, a first mode for carrying out this invention will be described with reference to the drawings.

Figure 1:
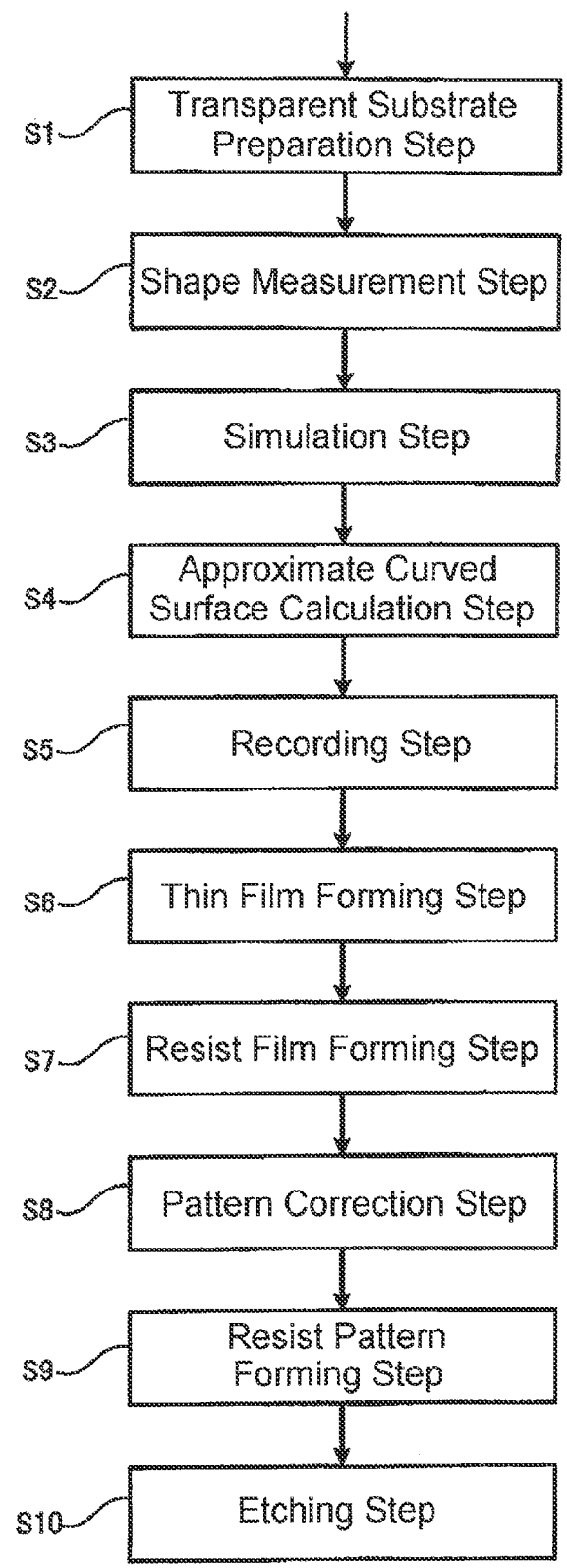
FIG. 1 is a flowchart showing a method of manufacturing a mask blank substrate, a method of manufacturing a mask blank, and a method of manufacturing a transfer mask according to this invention.

FIG. 1 is a flowchart showing a method of manufacturing a transfer mask including a method of manufacturing a mask blank substrate according to this invention.

The mask blank substrate manufacturing method according to this invention comprises steps including a transparent substrate (synthetic quartz glass substrate) preparation step (S1), a shape measurement step (S2), a simulation step (S3), an approximate curved surface calculation step (S4), and a recording step (S5). Then, a thin film for pattern formation is formed on a main surface of a manufactured mask blank substrate by a thin film forming step (S6), thereby manufacturing a mask blank.

Then, using the manufactured mask blank, a transfer mask is manufactured by a resist film forming step (S7), a pattern correction step (S8), a resist pattern forming step (S9), and an etching step (S10).

Hereinbelow, the above-mentioned respective steps will be described in sequence. Incidentally, when a film stress that affects deformation of the transparent substrate is present in the thin film for pattern formation formed on the transparent substrate, a film stress control step may be provided for the purpose of reducing the film stress. The resist film forming step (S7) may be included in the mask blank manufacturing steps. Hereinbelow, the above-mentioned respective steps will be described in sequence. Herein, the synthetic quartz glass is used as the transparent substrate, which, however, is not particularly limited as long as it can be used as a substrate of a transfer mask. For example, there can be cited a soda-lime glass, an aluminosilicate glass, a borosilicate glass, an alkali-free glass, or a calcium fluoride glass.

In the following description, the transparent substrate has a size of about 152 mm×about 152 mm×6.35 mm, which, however, is not particularly limited. Also in the case of a transparent substrate which is larger or smaller than about 152 mm×about 152 mm×6.35 mm, the same effect can be obtained. With respect to a flatness calculated from an after-chucking main surface shape of a substrate main surface, a region for calculating such a flatness can be properly set according to the size of a transparent substrate.

(A) Transparent Substrate Preparation Step (S1)

Figure 2:
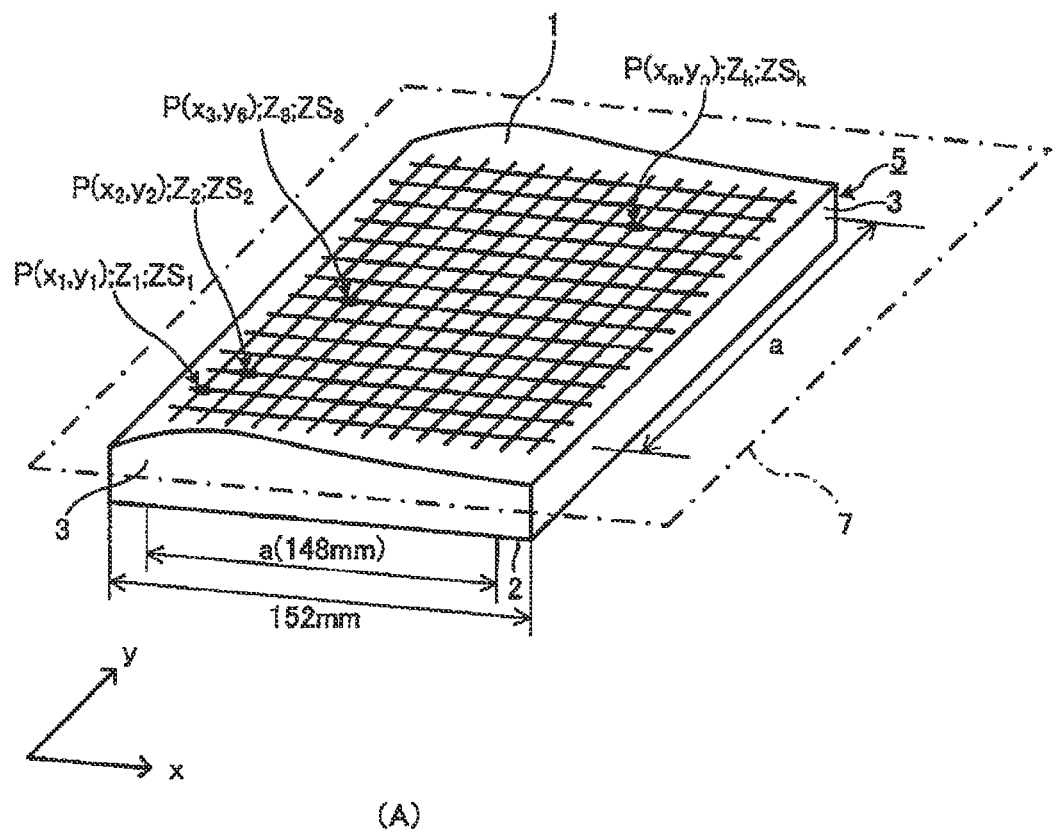
FIG. 2 is a perspective view of a transparent substrate for explaining measurement points in obtaining a before-chucking main surface shape and in calculating an after-chucking main surface shape through simulation.
Figure 2:
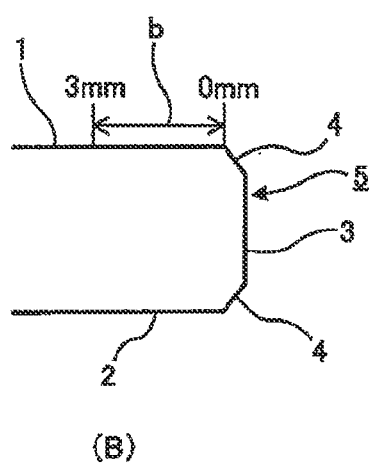

FIG. 2 (A) is a perspective view of a transparent substrate and FIG. 2 (B) is a cross-sectional view of an outer peripheral portion of the transparent substrate. The transparent substrate can be obtained by cutting a synthetic quartz glass ingot, produced by a generally known method, into about 152.4 mm×about 152.4 mm×about 6.8 mm. Chamfering and grinding of main surfaces and so on are applied to the obtained synthetic quartz glass plate, then, main surfaces 1 and 2, end faces 3, and chamfered surfaces 4 being the surfaces of the synthetic quartz glass plate are mirror-polished, and further, the main surfaces 1 and 2 are precision-polished, thereby preparing a transparent substrate (synthetic quartz glass substrate, about 152 mm×about 152 mm×6.35 mm) 5. A thin film for pattern formation (light-shielding film, light-semitransmissive film, or the like) will be formed on the main surface 1 in the thin film forming step. In the preparation step of the transparent substrate 5, the surface roughness of both main surfaces 1 and 2 of the transparent substrate 5 is set to about 0.2 nm or less by root mean square roughness (Rq) while the surface roughness of the end faces 3 and the chamfered surfaces 4 is set to about 0.03 μm or less by arithmetic mean roughness (Ra).

Herein, it is preferable that a marker in the form of a plurality of pits be provided by irradiating laser light, as described in JP-A-2006-309143, onto the surface of the prepared transparent substrate 5 at its portion (end face 3, chamfered surface 4, notch mark portion, peripheral region around a transfer pattern forming region of the main surface 1 or 2, or the like) which is free of the influence at the time of exposure by an exposure apparatus, and be used as an identification mark in the later steps. A marker, for use as an identification mark, of the transparent substrate 5 is not limited to such a marker on the surface of the transparent substrate 5, but may be formed by irradiating laser light from a plurality of laser light sources so as to be focused on the inside of the substrate to thereby locally modify it.

(B) Shape Measurement Step (S2)

As means for obtaining a before-chucking main surface shape which is a main surface shape of the main surface 1 of the transparent substrate 5 before it is placed on a mask stage, use can be made of a flatness measuring apparatus (not illustrated) utilizing a known optical interferometer, or the like. In order to suppress as much as possible deflection of the transparent substrate 5 due to its self-weight, the apparatus is preferably of the type that can measure the flatness in the state where the transparent substrate 5 is stood upright or substantially upright (free-standing state). The before-chucking main surface shape referred to herein represents, as shown in FIG. 2, height information Zk (k is an integer) from a reference plane 7 (a focal plane calculated by the method of least squares) at a plurality of measurement points P (Xm, Yn) (m and n are integers) in an actual measurement region (a×a) provided on the main surface 1 of the transparent substrate 5. It is preferable that the height information Zk be measured as accurately as possible and be measured in the order of nanometers. In FIG. 2, a grid on the main surface 1 of the transparent substrate 5 is virtual lines for showing the plurality of measurement points P (Xm, Yn) and is not real lines actually appearing on the main surface 1.

The above-mentioned actual measurement region (a×a) for measuring the before-chucking main surface shape is properly selected according to a size of the transparent substrate 5, a measurement accuracy of the flatness measuring apparatus, a region where the mask stage of the exposure apparatus contacts the main surface 1 of the transparent substrate 5, and so on. If possible, it is preferable to obtain the before-chucking main surface shape over the entire main surface 1 of the transparent substrate 5 in order to carry out a later-described simulation with high accuracy. However, it is set to include at least the region where the mask stage of the exposure apparatus contacts the main surface 1 of the transparent substrate 5 (i.e. the region where the transparent substrate 5 is chucked by the mask stage of the exposure apparatus).

In the case of the flatness measuring apparatus utilizing the existing optical interferometer, it is difficult to accurately measure the height information Zk at the outer peripheral portion of the transparent substrate 5, i.e. near the boundary between the main surface 1 and each chamfered surface 4 of the transparent substrate 5 as shown in FIG. 2 (B). In consideration of these points, the actual measurement region (a×a) of the main surface 1 for obtaining the before-chucking main surface shape is preferably set to a region obtained by excluding, from the entire main surface 1, a peripheral region b of more than 0 mm and 3 mm or less from each chamfered surface 4 of the transparent substrate 5. Particularly, the actual measurement region (a×a) for obtaining the before-chucking main surface shape is preferably set to a region obtained by excluding, from the entire main surface 1, a peripheral region b of 0.5 mm or more and 2.5 mm or less from each chamfered surface 4 of the transparent substrate 5 and is more preferably set to a region obtained by excluding, from the entire main surface 1, a peripheral region b of 1 mm or more and 2 mm or less from each chamfered surface 4 of the transparent substrate 5. For example, in the case of the transparent substrate 5 having a size of 152 mm×152 mm, the actual measurement region (a×a) for obtaining the before-chucking main surface shape is preferably set to 146 mm×146 mm and more preferably 148 mm×148 mm.

Further, in order to carry out the later-described simulation with high accuracy and to calculate an approximate curved surface with high accuracy, it is preferable that the measurement points P (Xm, Yn) for obtaining the height information Zk be set as many as possible. However, although more accurate simulation results can be achieved by increasing the number of the measurement points P (Xm, Yn), the simulation requires a lot of time. Therefore, it is preferable to determine the measurement points P (Xm, Yn) taking these points into account. For example, the measurement points P (Xm, Yn) can be set to 256×256 points.

The information of the before-chucking main surface shape thus obtained (respective measurement points P and various information about the substrate main surface such as height information Zk at those measurement points) may be recorded in a recording apparatus (PC, network server, IC tag, or the like) in association with the measured transparent substrate 5. This recorded information of the before-chucking main surface shape can be used in the later transfer mask manufacturing steps. In the case where the identification mark is formed in the transparent substrate 5 itself in the transparent substrate preparation step, the information of the before-chucking main surface shape (respective measurement points P and various information about the substrate main surface such as height information Zk at those measurement points) may be recorded in the recording apparatus in association with the identification mark.

(C) Simulation Step (S3)

In this simulation step, by simulating a state where the transparent substrate 5 is set (vacuum-chucked) on the mask stage of the exposure apparatus, height information ZSk (k is an integer) from the reference plane 7 (FIG. 2) is obtained at the plurality of measurement points P (Xm, Yn) on the main surface 1 of the transparent substrate 5.

Figure 3:
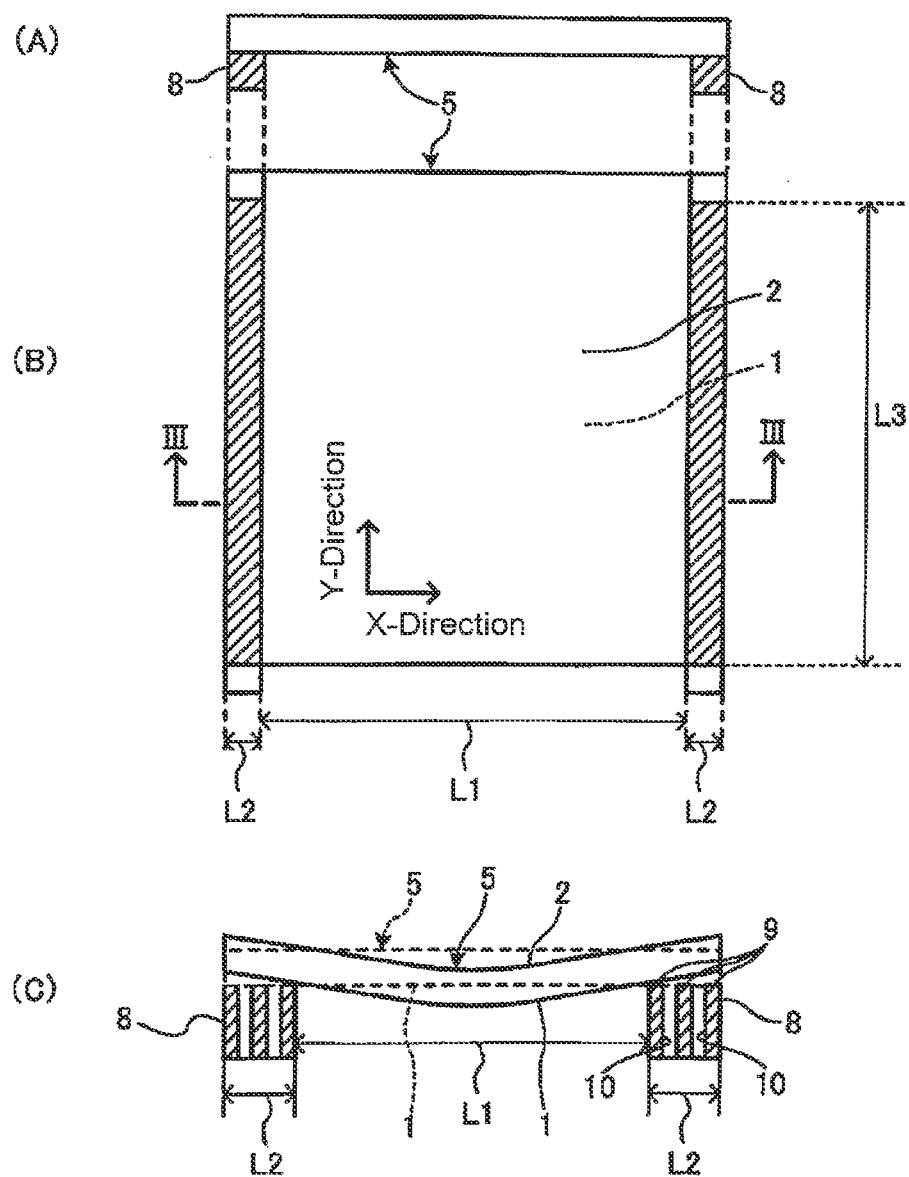
FIG. 3 is diagrams showing the transparent substrate set on a mask stage of an exposure apparatus.

FIG. 3 is diagrams showing a state where the transparent substrate 5 is set on a mask stage 8 of an exposure apparatus (not illustrated). FIG. 3 (B) is a diagram seen from above and FIG. 3 (A) is a cross-sectional view taken along line III-III. As shown in FIG. 3, the mask stage 8 comprises two vacuum chuck portions disposed parallel to each other on an X-Y plane which is substantially perpendicular to the direction of gravity. These two vacuum chuck portions are disposed at positions spaced apart from each other by a distance L1 in an X-direction, with their longitudinal directions each extending in a Y-direction (perpendicular to the X-direction). Each vacuum chuck portion has a width L2 in the X-direction and a length L3 in the Y-direction.

FIG. 3 (C) is a cross-sectional view taken along line III-III of FIG. 3 (B), wherein the shape of the transparent substrate 5 is exaggeratingly illustrated in order to facilitate understanding. Referring to FIG. 3 (C), the transparent substrate 5 in a state before setting (vacuum chucking) on the mask stage 8 is shown in solid line while the transparent substrate 5 in a state after setting (vacuum chucking) on the mask stage 8 is shown in broken line. Each of the two vacuum chuck portions forming the mask stage 8 may have a structure in which two suction ports 10 are formed between three support portions 9 each linearly extending parallel to the main surface 1 of the transparent substrate 5. The transparent substrate 5 is deflected due to gravity as shown in solid line when it is only placed on the mask stage 8. When the transparent substrate 5 is set (vacuum-chucked) on the mask stage 8, it is deformed to contact the mask stage 8 by vacuum chucking as shown in broken line.

In order to obtain, through simulation, the height information ZSk (FIG. 2 (A)) at the plurality of measurement points P (Xm, Yn) on the transparent substrate 5 when it is vacuum-chucked in the exposure apparatus, use is made of, for example, the height information Zk from the reference plane 7 at the plurality of measurement points P (Xm, Yn) on the main surface 1 of the transparent substrate 5, which was obtained in the above-mentioned surface shape information obtaining step, and shape information of the mask stage 8 of the exposure apparatus including regions where the mask stage 8 contacts the main surface 1 of the transparent substrate 5 (i.e. regions each having the X-direction width L2 and the Y-direction width L3 in the mask stage 8), wherein the shape information of the mask stage 8 includes (the width L2, the width L3, and the distance L1 between the regions of the mask stage 8). According to a deflection differential equation in mechanics of materials by the use of these information, it is possible to obtain, through simulation, the height information ZSk from the reference plane 7 at the plurality of measurement points P (Xm, Yn) on the main surface 1 of the transparent substrate 5 when it is vacuum-chucked on the mask stage 8 of the exposure apparatus.

The deflection differential equation is obtained, for example, in the following manner, wherein a positive direction of Z-axis is defined as the direction of gravity.

(height information $ZSk$ on the main surface of the transparent substrate when it is vacuum-chucked on the mask stage)

=(height information $Zk$ on the main surface of the transparent substrate obtained in the shape measurement step)

+(an estimated value of deformation due to deflection of the transparent substrate along the X-direction due to gravity)[gravity deformation amount]

+(an estimated value of warp of the transparent substrate along the X-direction with respect to the mask stage operable as fulcrums due to vacuum chucking (lever effect))[lever deformation amount]

+(an estimated value of deformation of the transparent substrate along the Y-direction (longitudinal direction of the mask stage) due to vacuum chucking)[copy deformation amount]

+(an estimated value of deformation (twist deformation) which acts in a direction to correct twist of the transparent substrate when the transparent substrate is vacuum-chucked on the mask stage) [twist deformation amount]

Herein, the X- and Y-directions are identified in FIG. 3 (B). The X-direction is a direction perpendicular to the longitudinal direction of the mask stage 8 while the Y-direction is a direction along the longitudinal direction of the mask stage 8. Further, "regions along the Y-direction where the transparent substrate contacts the mask stage" are obtained from the regions, as the shape information of the mask stage 8, where the mask stage 8 contacts the main surface 1 of the transparent substrate 5.

In the above-mentioned simulation step, in the case where the simulation is carried out by paying attention to the fact that the transparent substrate normally has the twist component and thus taking into account also the deformation (twist deformation) which acts in the direction to correct the twist of the transparent substrate 5 when the transparent substrate 5 is set (sucked) on the mask stage 8, it is possible to obtain accurate simulation results at the same level as compared with simulation results by the finite element method. Further, the time required for the simulation can be significantly shortened as compared with the finite element method.

The above-mentioned mask stage shape information may include, in addition to the regions where the mask stage 8 contacts the main surface 1 of the transparent substrate 5 (regions each having the X-direction width L2 and the Y-direction width L3), information about the flatness of the mask stage 8 in the above-mentioned regions (surfaces) where the mask stage 8 contacts the main surface 1 of the transparent substrate 5.

The simulation is not limited to a simulation by the above-mentioned method, but may be a simulation by the finite element method or the like.

The information of the after-chucking main surface shape thus obtained (various information about the main surface after chucking such as height information ZSk at the measurement points P obtained through simulation, information about the mask stage 8, etc.) may be recorded in the recording apparatus (PC, network server, IC tag, or the like) in association with the measured transparent substrate 5 in the same manner as in the case of the shape measurement step. This recorded information of the after-chucking main surface shape can be used in the later transfer mask manufacturing steps.

(D) Approximate Curved Surface Calculation Step (S4)

The approximate curved surface calculation step is a step of approximating the height information ZSk from the reference plane at the plurality of measurement points P (Xm, Yn), which is the information of the after-chucking main surface shape and was obtained in the simulation step, to a predetermined curved surface. In this step, ZSk at the respective measurement points P (Xm, Yn) is fitted to an n-th order polynomial curved surface (n is 4, 5, or 6) by, for example, the method of least squares.

For example, in the case of a fourth order polynomial curved surface, a polynomial $A_4$ (X, Y) is given by $$A_4(X,Y)=a[0,0]+a[1,0]X+a[0,1]Y+a[2,0]X^2+a[1,1]XY+a[0,2]Y^2+\ldots+a[j,k]X^jY^k+\ldots+a[0,4]Y^4.$$

In the above formula, a[j, k] is a coefficient of each term of the polynomial (j, k; integers of 0 to 4).

Figure 4:
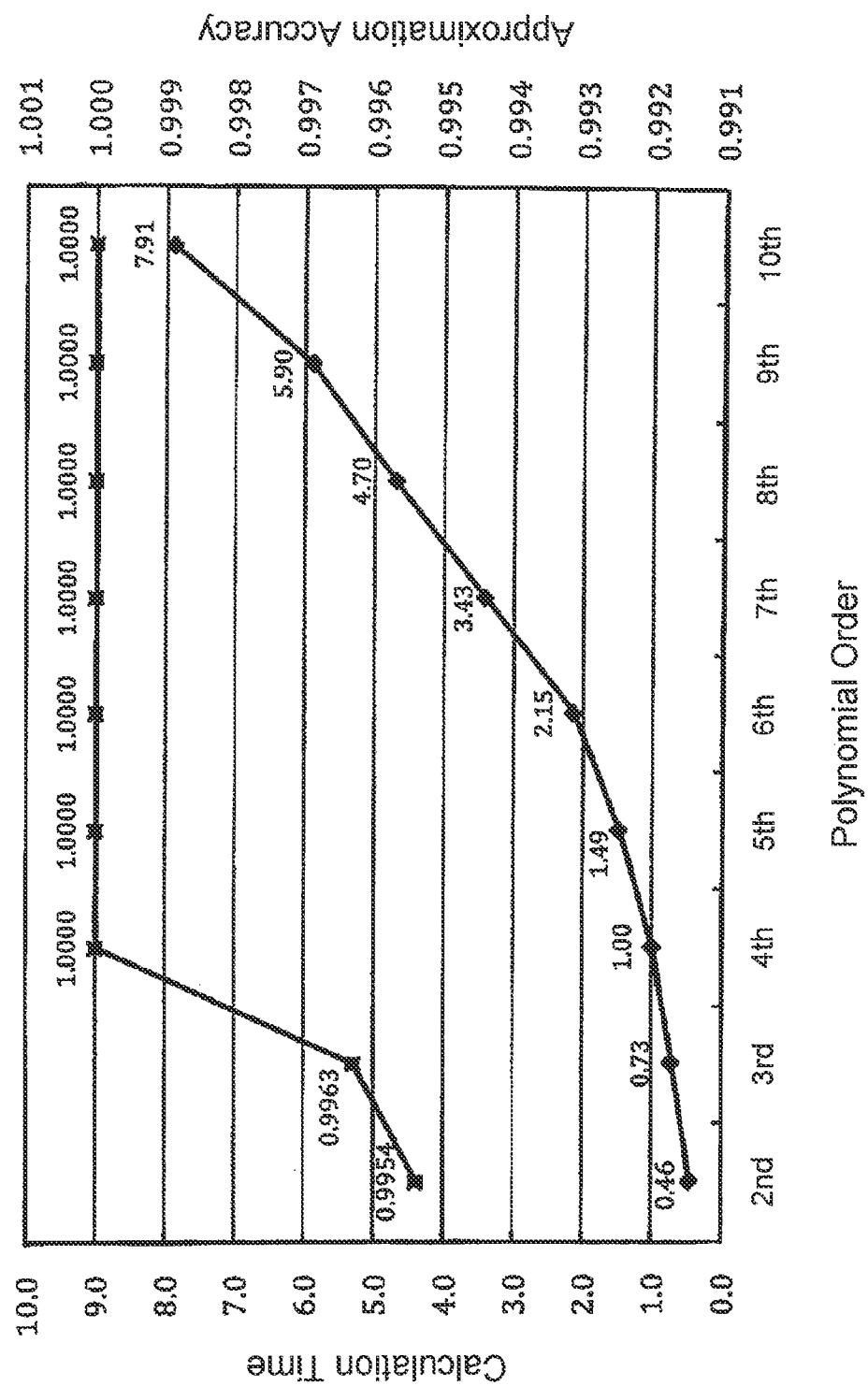
FIG. 4 is a diagram showing the relationship between the order of a polynomial to be approximated and the calculation time and the relationship between the order of a polynomial to be approximated and the approximation accuracy.

Herein, the results of examining the relationship between the order of a polynomial to be approximated and the calculation time required for fitting by the method of least squares and the relationship between the order of a polynomial to be approximated and the approximation accuracy are shown in FIG. 4. In FIG. 4, the abscissa axis represents the order of a polynomial to be approximated, wherein the second to tenth orders were examined. The left ordinate axis represents the calculation time required for approximation, wherein it is shown assuming that the time required for calculation of a fourth order polynomial is 1. The right ordinate axis represents the approximation accuracy, wherein it is shown assuming that the approximation accuracy of a fourth order polynomial is 1. Herein, as the approximation accuracy, the coefficient of determination (the ratio of the model sum of squares to the total sum of squares) is used as an index.

In FIG. 4, a mark ♦ indicates a calculation time. From this figure, it is seen that the calculation time increases as the order increases. On the other hand, from marks ■ each indicating an approximation accuracy, it is seen that the approximation accuracy hardly changes when the order is 4 or more. In the case of the seventh or higher order which requires three or more times the calculation time required for the fourth order, the approximation accuracy does not change while the calculation takes a lot of time. Accordingly, it is seen that the fourth, fifth, or sixth order is preferable as the order of a polynomial of an approximate curved surface because a sufficient approximation accuracy can be obtained in a short calculation time.

(E) Recording Step (S5)

In the recording step, the coefficients a[j, k] of the terms of the n-th order polynomial $A_n$ which was obtained as the approximate curved surface of ZSk at the respective measurement points P (Xm, Yn) in the approximation step are recorded, as coefficient information, in a generally used recording apparatus (medium such as, for example, PC, network server, IC tag, nonvolatile memory, CD-R, or DVD-R, or the like) in association with the transparent substrate. For example, a serial number is assigned to the transparent substrate and the coefficient information is recorded in association with the serial number. Further, information such as material and size of the transparent substrate is also recorded in association with the serial number.

For example, for the association between the transparent substrate and the serial number, a marker indicative of the serial number may be provided on the end face of the transparent substrate.

The above-mentioned steps from (A) Transparent Substrate Preparation Step to (E) Recording Step form a mask blank transparent substrate manufacturing method.

(F) Thin Film Forming Step (S6)

In the thin film forming step, a pattern-formation thin film for forming a mask pattern is formed, by sputtering, on the main surface of the mask blank substrate manufactured through the above-mentioned respective steps, thereby producing a mask blank. The formation of this thin film is carried out using, for example, a DC magnetron sputtering apparatus.

As the pattern-formation thin film, use can be made of a light-shielding film, a halftone phase shift film, a light-semi-transmissive film for use in an enhancer mask or the like, an etching mask film which is provided on such a film or used for producing a chromeless phase shift mask, or the like. As a material of the light-shielding film, there can be cited chromium, a material composed of a transition metal and silicon (transition metal silicide), or tantalum. The light-shielding film may be a single layer or may have a two-layer laminated structure of a light-shielding layer and a front-surface antireflection layer from the substrate side, a three-layer laminated structure of a back-surface antireflection layer, a light-shielding layer, and a front-surface antireflection layer from the substrate side, or the like. As the front-surface antireflection layer and the back-surface antireflection layer, it is preferable to use a material obtained by adding oxygen and/or nitrogen to a material of the light-shielding layer. As the transition metal in the transition metal silicide, use can be made of Mo, W, Ta, Ti, Hf, Zr, Pd, Nb, Ru, Ni, V, Rh, Cr, or the like. As a material of the phase shift film or the light-semitransmissive film, it is preferable to use CrO, CrON, CrOCN, or the like in the case of a chromium-based material, MSiON (M: transition metal, the same shall apply hereinafter), MSiO, MSiN, MSiOC, MSiOCN, or the like in the case of a transition metal silicide-based material, or TaO, TaON, TaBO, TaBON, or the like in the case of a tantalum-based material.

The pattern-formation thin film can be formed by sputtering. As a sputtering apparatus, use can be made of a DC magnetron sputtering apparatus, an RF magnetron sputtering apparatus, an ion-beam sputtering apparatus, or the like. When sputtering the light-shielding film on the mask blank substrate, it is preferable to rotate the substrate and to dispose a sputtering target at a position inclined by a predetermined angle with respect to a rotational axis of the substrate, thereby forming the light-shielding film. By such a film forming method, it is possible to reduce in-plane variation of the light-shielding film and thus to uniformly form the light-shielding film. Particularly in the case of the phase shift film or the light-semitransmissive film, when forming the film by rotating the substrate and disposing a sputtering target at a position inclined by a predetermined angle with respect to a rotational axis of the substrate, the in-plane distributions of the phase angle and the transmittance also change by the positional relationship between the substrate and the sputtering target. It is preferable to use a film forming method as described in JP-A-2003-280174.

(G) Resist Film Forming Step (S7)

Then, a resist is coated on a surface of the pattern-formation thin film in the mask blank by a normal method such as spin coating and thereafter a heat treatment is carried out to form a resist film. The resist is preferably a resist for electron beam writing exposure which is capable of forming a fine pattern, and is particularly preferably of the chemically amplified type. The above-mentioned steps from (A) Transparent Substrate Preparation Step to (F) Thin Film Forming Step or to (G) Resist Film Forming Step form a mask blank manufacturing method.

(H) Pattern Correction Step (S8)

In the pattern correction step, a design transfer pattern to be formed in the pattern-formation thin film is corrected using the coefficient information which was stored in association with the serial number of the transparent substrate in the recording step. Estimation of position shift amounts of the pattern which occurs when vacuum-chucked on the mask stage of the exposure apparatus is carried out by reproducing the polynomial of the approximate curved surface from the coefficient information, calculating polynomials by partially differentiating the reproduced polynomial with respect to X and Y, respectively, and then calculating estimated position shift amounts in the X- and Y-directions, respectively, by the technique described in the aforementioned prior art document. Then, using the calculated X- and Y-direction estimated position shift amounts, the design transfer pattern is corrected. Further, writing data for use in writing a resist pattern in the next step is produced from the corrected transfer pattern.

(I) Resist Pattern Forming Step (S9)

In the resist pattern forming step, the transfer pattern corrected in the pattern correction step (S8) is written by a general writing apparatus and then development and cleaning are carried out, thereby forming a resist pattern.

(J) Etching Step (S10)

In the etching step, using the resist pattern as a mask, the pattern-formation thin film formed in the thin film forming step (S6) is etched, thereby forming a transfer pattern (mask pattern). Finally, the resist pattern is removed, thereby obtaining a transfer mask in which the transfer pattern is formed on the mask blank substrate.

The above-mentioned steps from (A) Transparent Substrate Preparation Step to (J) Etching Step form a transfer mask manufacturing method.

(K) Semiconductor Device Manufacturing Step

The obtained transfer mask is set (vacuum-chucked) on the mask stage of the exposure apparatus. Using this transfer mask and according to the photolithography technique using ArF excimer laser as exposure light, the transfer pattern of the transfer mask is transferred onto a resist film formed on a semiconductor substrate so as to form a required circuit pattern on the semiconductor substrate, thereby manufacturing a semiconductor device.

In the above-mentioned mask blank substrate manufacturing method, it is preferable that, after calculating the after-chucking main surface shape in (C) Simulation Step (S3), a flatness of the substrate main surface be calculated in a predetermined calculation region from the information of the after-chucking main surface shape, that only such a substrate whose calculated flatness is a predetermined value or less be selected as a mask blank substrate, and that (D) Approximate Curved Surface Calculation Step (S4) and the subsequent steps be carried out for the selected mask blank substrate. This is because a mask blank substrate whose main surface flatness after chucking is poor is not suitable as a mask blank substrate for use in a transfer mask having a finer pattern than the DRAM hp45 generation, to which the immersion exposure technique is applied.

In this case, the calculation region is determined based on an exposure wavelength, the kind of a fine pattern (circuit pattern) to be formed on a semiconductor substrate, and so on. For example, in the case of a mask blank having a size of 152 mm×152 mm, a calculation region including a transfer region of a transfer mask can be set to a rectangular shape of 104 mm×132 mm with respect to the center of a substrate main surface or to a square shape of 132 mm×132 mm in consideration of disposing a transfer pattern in a state rotated by 90 degrees. Further, it is more preferable to ensure the flatness also in a peripheral region around 132 mm×132 mm and thus to set the calculation region to, for example, a square shape of 142 mm×142 mm.

The predetermined value of the flatness calculated from the after-chucking main surface shape is determined by calculating a flatness allowable for a mask blank (or a transfer mask) depending on an exposure wavelength, a substrate chuck system of a mask stage of an exposure apparatus, and so on. For example, when an exposure light source is an ArF excimer laser (exposure wavelength: 193 nm) and a substrate chuck system (a support portion structure for the transparent substrate 5) is of the type where, as shown in FIG. 3 (B), the two suction ports 10 are formed between the three support portions 9 each linearly extending parallel to the main surface 1 of the transparent substrate 5 and the transparent substrate 5 is supported by vacuum chucking in contact with the support portions 9, the above-mentioned specification is determined such that the flatness is 0.24 µm or less in the calculation region including the transfer region of the transfer mask. In the case of a transfer mask applied with the double patterning technique, the flatness is preferably set to 0.12 µm or less in the same calculation region as described above.

On the other hand, if the mask blank substrate is selected based only on the criterion that the main surface flatness after chucking is the predetermined value or less, even such a mask blank substrate whose main surface flatness before chucking is not good becomes a successful product. The mask blank substrate whose main surface flatness before chucking is not good while whose main surface flatness after chucking is good, i.e. the predetermined value or less, has a property that its main surface shape largely changes before and after chucking. In the case of a transfer mask manufactured using a transparent substrate whose main surface shape largely changes, the displacement amount on the X-Y plane of a transfer pattern formed by a pattern-formation thin film becomes relatively large before and after chucking. In the case of a mask blank substrate for use in a transfer mask having a finer pattern than the DRAM hp45 generation, to which the immersion exposure technique is applied, if the displacement amount (position shift) of a transfer pattern before and after chucking is large, the transfer accuracy is largely affected, which is not preferable. Particularly in the case of a mask blank substrate for use in a transfer mask applied with the double patterning technique, the position accuracy of a transfer pattern is strict and thus a serious problem arises if the displacement amount (position shift) of the transfer pattern is large. If this point is taken into account, it is preferable that, after measuring the before-chucking main surface shape of the transparent substrate 5 in (B) Shape Measurement Step, a flatness of the main surface before chucking be calculated in a predetermined calculation region and that only such a substrate whose calculated flatness is a predetermined value or less be selected and sent to the next step. In this case, it is preferable to carry out the first selection before (C) Simulation Step.

The predetermined region for calculating the flatness of the before-chucking main surface shape may be set the same as the calculation region for calculating the flatness of the after-chucking main surface shape, but it is preferable to ensure a larger region. In the case of a transparent substrate having a size of 152 mm×152 mm, it is preferable to ensure the flatness in a square region of 132 mm×132 mm with respect to the center of a substrate main surface and it is more preferable to ensure the flatness in a square region of 142 mm×142 mm. The predetermined value of the flatness is preferably set to 0.4 µm or less in the case of a mask blank substrate for use in a transfer mask having a finer pattern than the DRAM hp45 generation, to which the immersion exposure technique is applied, while, it is preferably set to 0.3 µm or less in the case of a mask blank substrate for use in a transfer mask applied with the double patterning technique.

When a film stress that contributes to deformation of the transparent substrate is present in the pattern-formation thin film formed on the transparent substrate, a film stress control step may be provided for the purpose of reducing the film stress. The film stress control step is, for example, such that a heat treatment is applied to the mask blank at a temperature of 150° C. or more at the time of and/or after forming a pattern-formation thin film or that a pattern-formation thin film formed on the mask blank substrate comprises a plurality of layers, i.e. has a laminated structure comprising a layer having a compressive stress and a layer having a tensile stress, thereby canceling the film stresses of the respective layers. Meanwhile, the pattern correction step (S8) may be carried out at any stage as long as it is after the n-th order polynomial $A_n$ of the approximate curved surface was calculated in the approximate curved surface calculation step (S4) and before the resist pattern forming step (S9).

Next, a second mode for carrying out this invention will be described with reference to the drawings.

Figure 5:
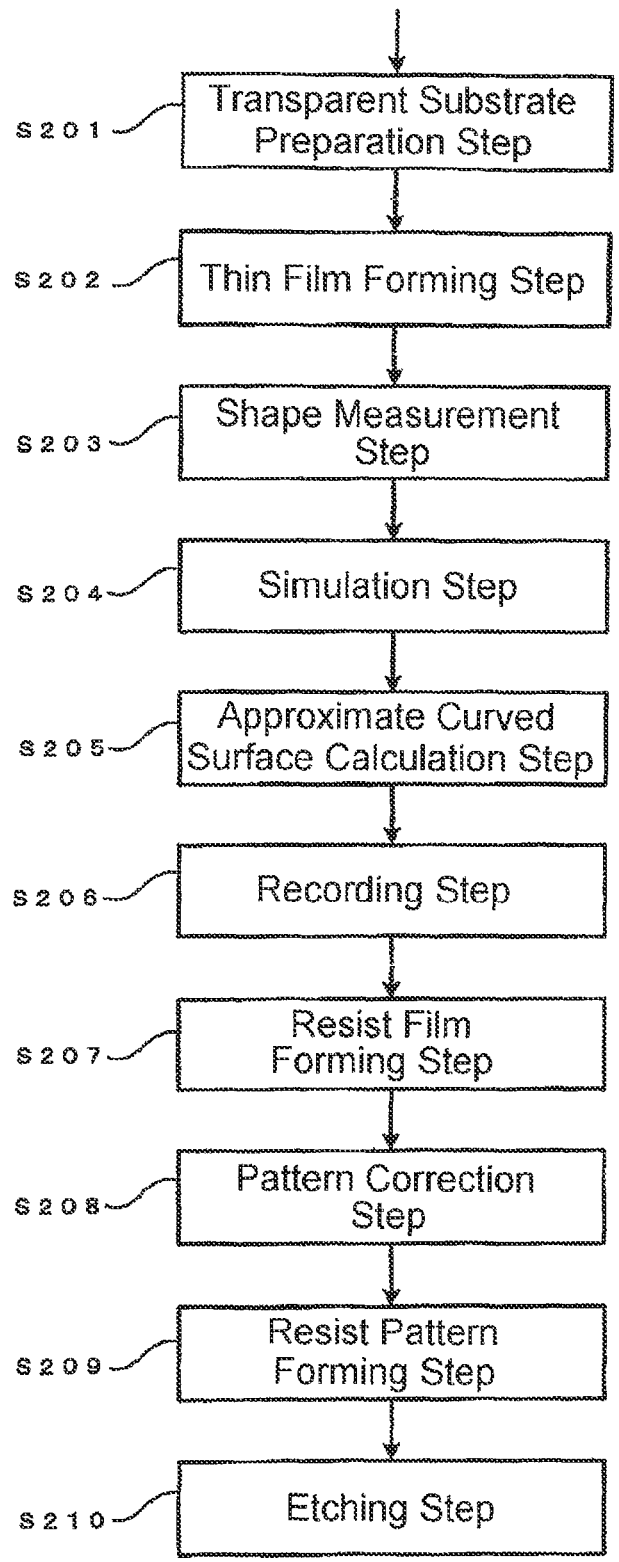
FIG. 5 is a flowchart showing a method of manufacturing a mask blank and a method of manufacturing a transfer mask according to this invention.

FIG. 5 is a flowchart showing a method of manufacturing a mask blank and a method of manufacturing a transfer mask according to this invention.

The second mode of the mask blank and transfer mask manufacturing methods of this invention comprises steps including a transparent substrate preparation step (S201), a thin film forming step (S202), a shape measurement step (S203), a simulation step (S204), an approximate curved surface calculation step (S205), and a recording step (S206). Then, using a manufactured mask blank, a transfer mask is manufactured by a resist film forming step (S207), a pattern correction step (S208), a resist pattern forming step (S209), and an etching step (S210). When a film stress that contributes to deformation of a transparent substrate is present in a pattern-formation thin film formed on the transparent substrate, a film stress control step may be provided for the purpose of reducing the film stress. The resist film forming step (S207) may be included in the mask blank manufacturing steps. With respect to the above-mentioned respective steps, portions different from the above-mentioned flowchart of FIG. 1 will be mainly described in sequence. Matters that will not be particularly described are the same as those in the above-mentioned first mode of the mask blank substrate manufacturing method according to this invention.

In the second mode, first, the transparent substrate preparation step (S201) is carried out in the same manner as the transparent substrate preparation step (S1) of the first mode, thereby preparing a transparent substrate 5. Then, the thin film forming step (S202) is carried out in the same manner as the thin film forming step (S6) of the first mode, thereby preparing a mask blank having a pattern-formation thin film formed on a main surface 1 of the transparent substrate 5 (steps from the transparent substrate preparation step (S201) to the thin film forming step (S202) correspond to mask blank preparation steps). If necessary, the film stress control step is carried out in the same manner as the film stress control step of the first mode to thereby reduce the stress of the pattern-formation thin film. The film stress of the pattern-formation thin film is such that an absolute value of a change amount of the main surface 1 before and after the film formation should be controlled to at least 0.1 µm or less by TIR (Total Indicated Reading) and is preferably less than 0.1 µm and desirably 50 nm or less.

Then, with respect to the mask blank, the shape measurement step (S203) is carried out in the same manner as the shape measurement step (S2) of the first mode, thereby obtaining a before-chucking main surface shape which is a main surface shape of a main surface of the mask blank before it is placed on the mask stage. Herein, the before-chucking main surface shape of the mask blank obtained by the flatness measuring apparatus is a surface shape of the pattern-formation thin film formed on the main surface 1 of the transparent substrate 5. However, the distribution of the thickness of the pattern-formation thin film formed by sputtering is quite uniform. Further, the film stress of the pattern-formation thin film is controlled to be very low. Therefore, even if the surface shape of the pattern-formation thin film is deemed to be equivalent to a before-chucking main surface shape of the main surface 1 of the transparent substrate 5, the simulation accuracy is not substantially affected.

Then, using the obtained before-chucking main surface shape of the mask blank, the simulation step (S204) is carried out in the same manner as the simulation step (S3) of the first mode, thereby obtaining an after-chucking main surface shape of the mask blank. The deflection differential equation used in the simulation step (S204) is for the transparent substrate. However, the thickness of the transparent substrate is about 6 mm while the thickness of the pattern-formation thin film is 100 nm or less and, therefore, the influence upon the area moment of inertia and so on is very small. Further, the film stress of the pattern-formation thin film is controlled to be very low. Therefore, even if the after-chucking main surface shape of the mask blank is calculated through simulation based on the deflection differential equation for the transparent substrate, the simulation accuracy is not substantially affected. The after-chucking main surface shape of the mask blank obtained herein can be deemed to be equivalent to an after-chucking main surface shape of the transparent substrate.

Then, using the obtained after-chucking main surface shape of the mask blank, the approximate curved surface calculation step (S205) is carried out in the same manner as the approximate curved surface calculation step (S4) of the first mode, thereby calculating an n-th order polynomial $A_n$ of an approximate curved surface. Further, the recording step (S206) is carried out in the same manner as the recording step (S5) of the first mode, thereby recording coefficients a[j, k] of respective terms of the calculated n-th order polynomial $A_n$ as coefficient information in association with the mask blank.

Subsequently, the resist film forming step (S207) is carried out in the same manner as the resist film forming step (S7) of the first mode, thereby forming a resist film on the pattern-formation thin film of the mask blank. Then, the pattern correction step (S208) is carried out in the same manner as the pattern correction step (S8) of the first mode, thereby correcting a design transfer pattern to be formed in the pattern-formation thin film. Subsequently, the resist pattern forming step (S209) is carried out in the same manner as the resist pattern forming step (S9) of the first mode, thereby writing a corrected transfer pattern by the writing apparatus and, through development and cleaning, forming a resist pattern.

Further, in the same manner as the etching step (S10) of the first mode, the pattern-formation thin film is etched using the resist pattern as a mask, thereby obtaining a transfer mask. Further, using the obtained transfer mask and according to the photolithography technique using ArF excimer laser as exposure light, a transfer pattern of the transfer mask is transferred onto a resist film formed on a semiconductor substrate (semiconductor wafer). In this manner, a required circuit pattern is formed on the semiconductor substrate, thereby manufacturing a semiconductor device.

In the above-mentioned mask blank manufacturing method, it is preferable that, after calculating the after-chucking main surface shape in the simulation step (S204), a flatness of the substrate main surface be calculated in a predetermined calculation region from the information of the after-chucking main surface shape, that only such a mask blank whose calculated flatness is a predetermined value or less be selected, and that the approximate curved surface calculation step (S205) and the subsequent steps be carried out for the selected mask blank. This is because a mask blank substrate whose main surface flatness after chucking is poor is not suitable as a mask blank substrate for use in a transfer mask having a finer pattern than the DRAM hp45 generation, to which the immersion exposure technique is applied. Further, in the above-mentioned transfer mask manufacturing method, a flatness of a before-chucking main surface shape and a flatness of an after-chucking main surface shape required for a mask blank may be determined from the accuracy required for a transfer pattern to be formed in a pattern-formation thin film and such a mask blank satisfying the determined criterion may be selected from among manufactured mask blanks.

Example

Hereinbelow, exposure mask manufacturing steps including mask blank transparent substrate manufacturing steps and mask blank manufacturing steps will be described in detail.

(I) Transparent Substrate Preparation Step (S1)

Main surfaces of square transparent substrates (synthetic quartz glass substrates) were precision-polished and cleaned, thereby preparing two transparent substrates (about 152 mm×about 152 mm×6.35 mm). In this event, using a carbon dioxide laser, a data matrix with a block size of 3 mm×3 mm was formed as an identification mark on an end face of each transparent substrate. In the data matrix, the symbol size was set to 12×12 (fixed: 10 digits) and the cell size was set to 0.25 mm. With this identification mark, a 10-digit serial number was assigned to each transparent substrate.

(II) Shape Measurement Step (S2)

With respect to each transparent substrate, using a flatness measuring apparatus (UltraFlat200M manufactured by Corning TROPEL Corporation) utilizing an optical interferometer, information of a before-chucking main surface shape (height information from a focal plane (virtual absolute plane) calculated by the method of least squares) was obtained at 256× 256 measurement points in an actual measurement region (148 mm×148 mm) on the main surface (the main surface where a thin film was to be formed) of the transparent substrate, and the information was stored in a computer (recording apparatus) in association with the serial number of the identification mark. In order to suppress as much as possible deflection of the transparent substrate due to its self-weight, the flatness was measured in the state where the transparent substrate was stood upright or substantially upright (free-standing). As a result of the measurement, the surface shape of the main surface (the main surface where the thin film was to be formed) of each transparent substrate was such that the height of the main surface was gradually reduced from its central region toward its peripheral portion and that the flatness in 148 mm×148 mm was 0.3 μm or less in each substrate and thus was good.

(III) Simulation Step (S3)

Based on the information of the before-chucking main surface shape obtained in the shape measurement step and shape information of a mask stage of an exposure apparatus in regions (about 10 mm×132 mm from two opposite end faces of the transparent substrate, respectively) where the mask stage contacts the main surface of the transparent substrate, height information from the reference plane when the transparent substrate was vacuum-chucked in the exposure apparatus (after-chucking main surface information) was calculated through simulation using a computer at the respective measurement points according to the above-mentioned deflection differential equation. From the calculated after-chucking main surface shape of each transparent substrate, a flatness was calculated in a 132 mm square region with respect to the substrate center and, as a result, the flatness of each substrate was 0.12 μm or less which was in a range usable for producing a transfer mask to which the double patterning technique was to be applied.

(IV) Approximate Curved Surface Calculation Step (S4)

The height information ZSk from the reference plane at the plurality of measurement points P (Xm, Yn), which was obtained in the simulation step, was fitted to, herein, a fourth order polynomial curved surface by the method of least squares. Herein, the approximate curved surface calculation step was carried out using a computer.

That is, by fitting to a polynomial $A_4$ (X, Y) given by the following formula, coefficients a[j, k] (j, k; integers of 0 to 4) of respective terms were obtained.

$$A_4(X,Y)=a[0,0]+a[1,0]X+a[0,1]Y+a[2,0]X^2+a[1,1]XY+a[0,2]Y^2+\ldots+a[j,k]X^jY^k+\ldots+a[0,4]Y^4$$

(where, a[j, k] is a coefficient of each term of the polynomial (j, k; integers of 0 to 4))

(V) Recording Step (S5)

Subsequently, the coefficients a[j, k] of the terms of the fourth order polynomial $A_4$ which was obtained as the approximate curved surface of ZSk at the respective measurement points P (Xm, Yn) in the approximate curved surface calculation step were stored as coefficient information in the recording apparatus in association with each transparent substrate. The material and size of each transparent substrate were also stored in the same manner. Specifically, the association was achieved by including in a data file name the serial number coded by the identification mark of each transparent substrate. Since the simulation results were not stored as they were, but the data of the approximate curved surface was used, it was possible to reduce the data amount.

(VI) Thin Film (Light-Shielding Film) Forming Step (S6-1)

A light-shielding film (pattern-formation thin film) comprising a light-shielding layer and a front-surface antireflection layer was formed on the main surface of each of the mask blank transparent substrates of which the surface shape information was obtained and which were subjected to the simulation.

Specifically, the transparent substrate was placed in a single-wafer DC magnetron sputtering apparatus. Using a mixed target of molybdenum (Mo) and silicon (Si) (at % ratio Mo:Si=21:79) as a sputtering target, a MoSiN film was formed in a mixed gas atmosphere of argon and nitrogen. Then, using a mixed target of molybdenum (Mo) and silicon (Si) (at % ratio Mo:Si=4:96) as a sputtering target, a MoSiON film was formed in a mixed gas atmosphere of argon, nitrogen, oxygen, and helium. In this manner, there was formed a light-shielding film made of MoSi-based materials and having a two-layer laminated structure comprising a light-shielding layer in the form of the MoSiN film (film composition ratio Mo:14.7 at %, Si:56.2 at %, N:29.1 at %) having a thickness of 50 nm and a front-surface antireflection layer in the form of the MoSiON film (film composition ratio Mo:2.6 at %, Si:57.1 at %, O:15.9 at %, N:24.4 at %) having a thickness of 10 nm. The elements of the respective layers of the light-shielding film were analyzed by the Rutherford backscattering spectrometry. The optical density (OD) of the light-shielding film at the wavelength of ArF excimer laser exposure light was 3.0.

Since the formed light-shielding film had a film stress, a film stress control step was carried out. Specifically, each mask blank substrate formed with the light-shielding film was heat-treated (annealed) at 450° C. for 30 minutes to thereby reduce the film stress of the light-shielding film so that the film stress of the light-shielding film was made substantially zero.

(VII) Thin Film (Etching Mask Film) Forming Step (S6-2)

With respect to each mask blank substrate formed with the light-shielding film, an etching mask film (pattern-formation thin film) was formed on the light-shielding film.

The transparent substrate was placed in a single-wafer DC magnetron sputtering apparatus. Using a chromium (Cr) target as a sputtering target, a CrOCN film as the etching mask film was formed to a thickness of 10 nm in a mixed gas atmosphere of argon, carbon dioxide, nitrogen, and helium.

Since the formed etching mask film had a film stress, a film stress control step was carried out. Each mask blank substrate formed with the etching mask was heat-treated (annealed) at a temperature lower than that of the annealing of the light-shielding film to thereby reduce the film stress of the etching mask film. Further, predetermined cleaning was carried out. In this manner, mask blanks were manufactured.

(VIII) Resist Film Forming Step (S7)

A resist film (chemically amplified resist for electron beam writing exposure: PRL009 manufactured by FUJIFILM Electronic Materials Co., Ltd.) was formed by spin coating on the etching mask film of each of the manufactured mask blanks and then prebaked, thereby forming a resist film having a thickness of 100 nm. In this manner, resist-film-coated mask blanks were obtained.

(IX) Transfer Pattern Correction Step (S8)

In the transfer pattern correction step, using the coefficient information recorded in association with the serial numbers of the transparent substrates in the recording step, a process of correcting design transfer patterns was carried out using a computer according to the method described above. The design transfer patterns used herein were obtained by dividing a single fine high-density design pattern corresponding to the DRAM hp32 nm generation into two relatively sparse design patterns using the double patterning technique. That is, the two mask blanks and the transfer patterns to be formed thereon were associated with each other to obtain sets and then design transfer pattern correction was carried out per set. From the corrected design transfer patterns, writing data for use in writing resist patterns in the next step were produced, respectively.

In this invention, the simulation results were not used as they were, but data of an approximate curved surface was used for correcting a transfer pattern and, in the approximate curved surface, data were interpolated for regions between measurement points P of a substrate main surface. Therefore, it was possible to easily perform calculation of position shift amounts and correction of a design transfer pattern also for the regions between the measurement points P. Further, since a fourth order polynomial curved surface was selected as an approximate curved surface, it was possible to shorten the calculation time and simultaneously to ensure the approximation accuracy.

(X) Resist Pattern Forming Step (S9)

Subsequently, each of the transfer patterns corrected in the transfer pattern correction step (S8) was written on the resist film of the associated mask blank by an electron beam writing exposure apparatus and then development and cleaning were carried out, thereby forming a resist pattern.

(XI) Etching Step (S10)

In the etching step, using the resist pattern as a mask, the etching mask film was dry-etched by a mixed gas of chlorine and oxygen to thereby transfer the transfer pattern to the etching mask film. Then, using the etching mask film as a mask, the light-shielding film was dry-etched to thereby form a transfer pattern. In this event, a mixed gas of $SF_6$ and He was used as an etching gas. Finally, the etching mask film was stripped by dry etching using a mixed gas of chlorine and oxygen and then predetermined cleaning was carried out. In this manner, two transfer masks (set) for double patterning were manufactured.

(XII) Semiconductor Device Manufacturing Step

Using the manufactured two transfer masks (set), a semiconductor device was manufactured according to the double patterning technique (double exposure technique). The first transfer mask was set (vacuum-chucked) on a mask stage of an exposure apparatus and the first transfer pattern was exposed and transferred onto a resist film on a semiconductor substrate using ArF exposure light. Subsequently, the second transfer mask was set (vacuum-chucked) on the mask stage of the exposure apparatus and the second transfer pattern was exposed and transferred onto the same resist film on the semiconductor substrate using ArF exposure light. As a result, a single fine high-density transfer pattern corresponding to the DRAM hp32 nm generation was exposed and transferred onto the resist film on the semiconductor substrate. Predetermined development was applied to the resist film on the semiconductor substrate. Then, a circuit pattern was transferred, by dry etching, to a thin film underlying the pattern of the resist film. The transferred circuit pattern was inspected. As a result, it was confirmed that the circuit pattern was accurately transferred without any shorted or disconnected portion. That is, it was proved that there was formed the transfer pattern adapted to the change in main surface shape when the transfer mask was chucked on the mask stage, and thus that the accuracy of the simulation for the transparent substrate of this invention was sufficiently high. Using other transfer mask sets manufactured in the same manner as described above, a laminated structure of circuit patterns was formed on the semiconductor substrate. In this manner, a semiconductor device was manufactured. The obtained semiconductor device was inspected. As a result, it was confirmed that the semiconductor device operated normally.

While the preferred embodiments of this invention have been described with reference to the accompanying drawings, it is needless to say that this invention is not limited thereto. It is apparent that a person skilled in the art can think of various changes and modifications in the category described in claims and it is understood that those also naturally belong to the technical scope of this invention.

For example, while the coefficients a[j, k] of the terms of the n-th order polynomial $A_n$ are used as the coefficient information in the approximation step (S4), but not limited thereto, and, for example, coefficients of respective polynomials of an X partial differential curved surface and a Y partial differential curved surface of the n-th order polynomial $A_n$ may be used as coefficient information. When actually correcting a transfer pattern, the correction can be carried out using a polynomial of a differential curved surface and the thickness of a transparent substrate.

DESCRIPTION OF SYMBOLS 1, 2 main surface
3 end face
4 chamfered surface
5 transparent substrate
7 reference plane
8 mask stage

The invention claimed is:

1. A method of manufacturing a mask blank substrate, comprising:
   a preparation step of preparing a transparent substrate having a precision-polished main surface;
   a shape measurement step of measuring height information of the main surface from a reference plane at a plurality of measurement points set in an actual measurement region of the main surface, thereby obtaining a before-chucking main surface shape;
   a simulation step of obtaining, through simulation, an after-chucking main surface shape which is height information of the main surface from the reference plane at the plurality of measurement points when the transparent substrate is chucked on a mask stage of an exposure apparatus;
   an approximate curved surface calculation step of calculating an approximate curved surface based on the after-chucking main surface shape; and
   a recording step of recording information of the approximate curved surface in a recording apparatus in association with the transparent substrate.

2. The method of manufacturing a mask blank substrate according to claim 1, wherein
   the approximate curved surface is given by a function of several variables expressed by a three-dimensional coordinate system which is obtained by setting an X-coordinate axis and a Y-coordinate axis on the reference plane and setting a Z-coordinate axis in a direction perpendicular to the reference plane, and
   the recording step records information of coefficients of the function of several variables as the information of the approximate curved surface in the recording apparatus.

3. The method of manufacturing a mask blank substrate according to claim 2, wherein the approximate curved surface is given by the function of several variables in which X or Y is of fourth or higher degree.

4. The method of manufacturing a mask blank substrate according to claim 2, further comprising
   a partial differential function calculation step of calculating an X partial differential function by partially differentiating the function of several variables with respect to X and calculating a Y partial differential function by partially differentiating the function of several variables with respect to Y,
   wherein the recording step also records information of coefficients of the X partial differential function and the Y partial differential function as information of the approximate curved surface in the recording apparatus.

5. The method of manufacturing a mask blank substrate according to claim 1, wherein the simulation step comprises:
   calculating a gravity deformation amount which is a deformation amount of the main surface caused by gravity when the transparent substrate is placed on the mask stage;
   calculating a lever deformation amount which is caused by lever deformation of the main surface with respect to the mask stage operable as a fulcrum when the transparent substrate is chucked on the mask stage, a copy deformation amount which is caused by deformation of the main surface following a shape of the mask stage when the transparent substrate is chucked on the mask stage, and a twist deformation amount which is caused by deformation of the main surface that corrects twist thereof when the transparent substrate is chucked on the mask stage; and
   calculating the after-chucking main surface shape by adding the calculated deformation amounts to the before-chucking main surface shape.

6. The method of manufacturing a mask blank substrate according to claim 1, comprising a selection step of selecting, as a mask blank substrate, the transparent substrate whose flatness in a calculation region obtained from the after-chucking main surface shape is a predetermined value or less.

7. The method of manufacturing a mask blank substrate according to claim 6, wherein the calculation region is a 132 mm square region with respect to a center of the transparent substrate.

8. The method of manufacturing a mask blank substrate according to claim 6, wherein the predetermined value of the flatness is 0.24 μm or less.

9. The method of manufacturing a mask blank substrate according to claim 1, comprising a step of selecting the transparent substrate whose flatness in a predetermined region obtained from the before-chucking main surface shape is 0.4 μm or less.

10. A method of manufacturing a mask blank, comprising a thin film forming step of forming a pattern-formation thin film on the main surface of the mask blank substrate manufactured by the method of manufacturing a mask blank substrate according to claim 1.

11. A method of manufacturing a transfer mask using the mask blank manufactured by the method of manufacturing a mask blank according to claim 10, comprising:
    a resist film forming step of forming a resist film on the pattern-formation thin film of the mask blank;
    a pattern correction step of correcting a transfer pattern, to be formed in the resist film, based on the information of the approximate curved surface; and
    a resist pattern forming step of forming, in the resist film, the transfer pattern corrected in the pattern correction step.

12. A method of manufacturing a semiconductor device, comprising a step of, by the use of the transfer mask manufactured by the method of manufacturing a transfer mask according to claim 11, exposing and transferring the transfer pattern of the transfer mask to a resist film on a wafer by photolithography.

13. A method of manufacturing a mask blank, comprising a thin film forming step of forming a pattern-formation thin film on the main surface of the mask blank substrate manufactured by the method of manufacturing a mask blank substrate according to claim 1.

14. A method of manufacturing a transfer mask using the mask blank manufactured by the method of manufacturing a mask blank according to claim 13, comprising:
    a resist film forming step of forming a resist film on the pattern-formation thin film of the mask blank;

a pattern correction step of correcting a transfer pattern, to be formed in the resist film, based on the information of the approximate curved surface; and a resist pattern forming step of forming, in the resist film, the transfer pattern corrected in the pattern correction step.

15. A method of manufacturing a semiconductor device, comprising a step of, by the use of the transfer mask manufactured by the method of manufacturing a transfer mask according to claim 14, exposing and transferring the transfer pattern of the transfer mask to a resist film on a wafer by photolithography.

16. A method of manufacturing a mask blank substrate, comprising:

a preparation step of preparing a transparent substrate having a precision-polished main surface;

a shape measurement step of measuring height information of the main surface from a reference plane at a plurality of measurement points set in an actual measurement region of the main surface, thereby obtaining a before-chucking main surface shape;

a simulation step of obtaining, through simulation, an after-chucking main surface shape which is height information of the main surface from the reference plane at the plurality of measurement points when the transparent substrate is chucked on a mask stage of an exposure apparatus;

an approximate curved surface calculation step of calculating, based on the after-chucking main surface shape, an approximate curved surface given by a function of several variables expressed by a three-dimensional coordinate system which is obtained by setting an X-coordinate axis and a Y-coordinate axis on the reference plane and setting a Z-coordinate axis in a direction perpendicular to the reference plane;

a partial differential function calculation step of calculating an X partial differential function by partially differentiating the function of several variables with respect to X and calculating a Y partial differential function by partially differentiating the function of several variables with respect to Y; and a recording step of recording information of coefficients of the X partial differential function and the Y partial differential function as information of the approximate curved surface in a recording apparatus in association with the transparent substrate.

17. The method of manufacturing a mask blank substrate according to claim 16, wherein the approximate curved surface is given by the function of several variables in which X or Y is of fourth or higher degree.

18. The method of manufacturing a mask blank substrate according to claim 16, wherein the simulation step comprises:

calculating a gravity deformation amount which is a deformation amount of the main surface caused by gravity when the transparent substrate is placed on the mask stage;

calculating a lever deformation amount which is caused by lever deformation of the main surface with respect to the mask stage operable as a fulcrum when the transparent substrate is chucked on the mask stage, a copy deformation amount which is caused by deformation of the main surface following a shape of the mask stage when the transparent substrate is chucked on the mask stage, and a twist deformation amount which is caused by deformation of the main surface that corrects twist thereof when the transparent substrate is chucked on the mask stage; and calculating the after-chucking main surface shape by adding the calculated deformation amounts to the before-chucking main surface shape.

19. A method of manufacturing a mask blank, comprising:

a preparation step of preparing a mask blank having a thin film on a main surface of a transparent substrate;

a shape measurement step of measuring height information of a main surface of the mask blank from a reference plane at a plurality of measurement points set in an actual measurement region of the main surface, thereby obtaining a before-chucking main surface shape;

a simulation step of obtaining, through simulation, an after-chucking main surface shape which is height information of the main surface from the reference plane at the plurality of measurement points when the mask blank is chucked on a mask stage of an exposure apparatus;

an approximate curved surface calculation step of calculating an approximate curved surface based on the after-chucking main surface shape; and a recording step of recording information of the approximate curved surface in a recording apparatus in association with the mask blank.

20. The method of manufacturing a mask blank according to claim 19, wherein:

the approximate curved surface is given by a function of several variables expressed by a three-dimensional coordinate system which is obtained by setting an X-coordinate axis and a Y-coordinate axis on the reference plane and setting a Z-coordinate axis in a direction perpendicular to the reference plane, and the recording step records information of coefficients of the function of several variables as the information of the approximate curved surface in the recording apparatus.

21. The method of manufacturing a mask blank according to claim 20, wherein the approximate curved surface is given by the function of several variables in which X or Y is of fourth or higher degree.

22. The method of manufacturing a mask blank according to claim 20, further comprising:

a partial differential function calculation step of calculating an X partial differential function by partially differentiating the function of several variables with respect to X and calculating a Y partial differential function by partially differentiating the function of several variables with respect to Y, wherein the recording step also records information of coefficients of the X partial differential function and the Y partial differential function as information of the approximate curved surface in the recording apparatus.

23. The method of manufacturing a mask blank according to claim 19, wherein the simulation step comprises:

calculating a gravity deformation amount which is a deformation amount of the main surface caused by gravity when the mask blank is placed on the mask stage;

calculating a lever deformation amount which is caused by lever deformation of the main surface with respect to the mask stage operable as a fulcrum when the mask blank is chucked on the mask stage, a copy deformation amount which is caused by deformation of the main surface following a shape of the mask stage when the mask blank is chucked on the mask stage, and a twist deformation amount which is caused by deformation of the main surface that corrects twist thereof when the mask blank is chucked on the mask stage; and calculating the after-chucking main surface shape by adding the calculated deformation amounts to the before-chucking main surface shape.

24. The method of manufacturing a mask blank according to claim 19, comprising a selection step of selecting the mask blank whose flatness in a calculation region obtained from the after-chucking main surface shape is a predetermined value or less.

25. The method of manufacturing a mask blank according to claim 24, wherein the calculation region is a 132 mm square region with respect to a center of the transparent substrate.

26. The method of manufacturing a mask blank according to claim 24, wherein the predetermined value of the flatness is 0.24 μm or less.

27. The method of manufacturing a mask blank according to claim 19, comprising a step of selecting the mask blank whose flatness in a predetermined region obtained from the before-chucking main surface shape is 0.4 μm or less.

28. A method of manufacturing a transfer mask using the mask blank manufactured by the method of manufacturing a mask blank according to claim 19, comprising:
a resist film forming step of forming a resist film on the pattern-formation thin film of the mask blank;
a pattern correction step of correcting a transfer pattern, to be formed in the resist film, based on the information of the approximate curved surface; and
a resist pattern forming step of forming, in the resist film, the transfer pattern corrected in the pattern correction step.

29. A method of manufacturing a semiconductor device, comprising a step of, by the use of the transfer mask manufactured by the method of manufacturing a transfer mask according to claim 28, exposing and transferring the transfer pattern of the transfer mask to a resist film on a wafer by photolithography.

30. A method of manufacturing a mask blank, comprising:
a preparation step of preparing a mask blank having a thin film on a main surface of a transparent substrate;
a shape measurement step of measuring height information of a main surface of the mask blank from a reference plane at a plurality of measurement points set in an actual measurement region of the main surface, thereby obtaining a before-chucking main surface shape;
a simulation step of obtaining, through simulation, an after-chucking main surface shape which is height information of the main surface from the reference plane at the plurality of measurement points when the mask blank is chucked on a mask stage of an exposure apparatus;
an approximate curved surface calculation step of calculating, based on the after-chucking main surface shape, an approximate curved surface given by a function of several variables expressed by a three-dimensional coordinate system which is obtained by setting an X-coordinate axis and a Y-coordinate axis on the reference plane and setting a Z-coordinate axis in a direction perpendicular to the reference plane;
a partial differential function calculation step of calculating an X partial differential function by partially differentiating the function of several variables with respect to X and calculating a Y partial differential function by partially differentiating the function of several variables with respect to Y; and
a recording step of recording information of coefficients of the X partial differential function and the Y partial differential function as information of the approximate curved surface in a recording apparatus in association with the transparent substrate.

31. The method of manufacturing a mask blank according to claim 30, wherein the approximate curved surface is given by the function of several variables in which X or Y is of fourth or higher degree.

32. The method of manufacturing a mask blank according to claim 30, wherein the simulation step comprises:
calculating a gravity deformation amount which is a deformation amount of the main surface caused by gravity when the mask blank is placed on the mask stage;
calculating a lever deformation amount which is caused by lever deformation of the main surface with respect to the mask stage operable as a fulcrum when the mask blank is chucked on the mask stage, a copy deformation amount which is caused by deformation of the main surface following a shape of the mask stage when the mask blank is chucked on the mask stage, and a twist deformation amount which is caused by deformation of the main surface that corrects twist thereof when the mask blank is chucked on the mask stage; and
calculating the after-chucking main surface shape by adding the calculated deformation amounts to the before-chucking main surface shape.

33. A method of manufacturing a transfer mask using the mask blank manufactured by the method of manufacturing a mask blank according to claim 32, comprising:
a resist film forming step of forming a resist film on the pattern-formation thin film of the mask blank;
a pattern correction step of correcting a transfer pattern, to be formed in the resist film, based on the information of the approximate curved surface; and
a resist pattern forming step of forming, in the resist film, the transfer pattern corrected in the pattern correction step.

34. A method of manufacturing a semiconductor device, comprising a step of, by the use of the transfer mask manufactured by the method of manufacturing a transfer mask according to claim 33, exposing and transferring the transfer pattern of the transfer mask to a resist film on a wafer by photolithography.

35. A method of manufacturing a transfer mask, comprising:
a preparation step of preparing a mask blank having a thin film on a main surface of a transparent substrate;
a shape measurement step of measuring height information of a main surface of the mask blank from a reference plane at a plurality of measurement points set in an actual measurement region of the main surface, thereby obtaining a before-chucking main surface shape;
a simulation step of obtaining, through simulation, an after-chucking main surface shape which is height information of the main surface from the reference plane at the plurality of measurement points when the mask blank is chucked on a mask stage of an exposure apparatus;
an approximate curved surface calculation step of calculating an approximate curved surface based on the after-chucking main surface shape;
a resist film forming step of forming a resist film on the pattern-formation thin film of the mask blank;
a pattern correction step of correcting a transfer pattern, to be formed in the resist film, based on information of the approximate curved surface; and
a resist pattern forming step of forming, in the resist film, the transfer pattern corrected in the pattern correction step.

36. The method of manufacturing a transfer mask according to claim 35, wherein the approximate curved surface is given by a function of several variables expressed by a three-dimensional coordinate system which is obtained by setting an X-coordinate axis and a Y-coordinate axis on the reference plane and setting a Z-coordinate axis in a direction perpendicular to the reference plane.

37. The method of manufacturing a transfer mask according to claim 36, wherein the approximate curved surface is given by the function of several variables in which X or Y is of fourth or higher degree.

38. The method of manufacturing a transfer mask according to claim 36, comprising
a partial differential function calculation step of calculating an X partial differential function by partially differentiating the function of several variables with respect to X and calculating a Y partial differential function by partially differentiating the function of several variables with respect to Y.

39. The method of manufacturing a transfer mask according to claim 35, wherein the simulation step comprises:
calculating a gravity deformation amount which is a deformation amount of the main surface caused by gravity when the mask blank is placed on the mask stage;
calculating a lever deformation amount which is caused by lever deformation of the main surface with respect to the mask stage operable as a fulcrum when the mask blank is chucked on the mask stage, a copy deformation amount which is caused by deformation of the main surface following a shape of the mask stage when the mask blank is chucked on the mask stage, and a twist deformation amount which is caused by deformation of the main surface that corrects twist thereof when the mask blank is chucked on the mask stage; and
calculating the after-chucking main surface shape by adding the calculated deformation amounts to the before-chucking main surface shape.

40. The method of manufacturing a transfer mask according to claim 35, comprising a selection step of selecting the mask blank whose flatness in a calculation region obtained from the after-chucking main surface shape is a predetermined value or less.

41. The method of manufacturing a transfer mask according to claim 40, wherein the calculation region is a 132 mm square region with respect to a center of the transparent substrate.

42. The method of manufacturing a transfer mask according to claim 40, wherein the predetermined value of the flatness is 0.24 μm or less.

43. The method of manufacturing a transfer mask according to claim 35, comprising a step of selecting the mask blank whose flatness in a predetermined region obtained from the before-chucking main surface shape is 0.4 μm or less.

44. A method of manufacturing a semiconductor device, comprising a step of, by the use of the transfer mask manufactured by the method of manufacturing a transfer mask according to claim 35, exposing and transferring the transfer pattern of the transfer mask to a resist film on a wafer by photolithography.

* * * * *